United States Patent
Chen et al.

(10) Patent No.: US 9,563,738 B2
(45) Date of Patent: Feb. 7, 2017

(54) OPTICAL PROXIMITY CORRECTION METHOD

(71) Applicant: UNITED MICROELECTRONICS CORP., Hsin-Chu (TW)

(72) Inventors: Yen-Hung Chen, Kaohsiung (TW); Chin-Lung Lin, Hsinchu (TW); Kuan-Wen Fang, Tainan (TW); Po-Ching Su, Tainan (TW); Hung-Wei Lin, Tainan (TW); Sheng-Lung Teng, Tainan (TW); Lun-Wen Yeh, Hualien County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 16 days.

(21) Appl. No.: 14/690,481

(22) Filed: Apr. 20, 2015

(65) Prior Publication Data

US 2016/0306912 A1 Oct. 20, 2016

(51) Int. Cl.
 *G06F 17/50* (2006.01)
 *G03F 1/36* (2012.01)
 *H01L 21/768* (2006.01)

(52) U.S. Cl.
 CPC .............. *G06F 17/5081* (2013.01); *G03F 1/36* (2013.01); *H01L 21/76807* (2013.01)

(58) Field of Classification Search
 CPC ................... H01L 21/76816; H01L 21/76807; H01L 23/5226; H01L 23/528; H01L 27/0207; G03F 7/0035
 See application file for complete search history.

(56) References Cited

U.S. PATENT DOCUMENTS

| 7,698,676 | B1 | 4/2010 | Qian | |
|---|---|---|---|---|
| 7,984,395 | B2 | 7/2011 | Cork | |
| 2008/0270969 | A1* | 10/2008 | Wu | G03F 1/144 716/55 |
| 2009/0061362 | A1* | 3/2009 | Taoka | G03F 1/144 430/319 |
| 2009/0298205 | A1* | 12/2009 | Nagahara | G03F 1/144 438/14 |
| 2013/0157178 | A1* | 6/2013 | Tsai | G03F 1/70 430/5 |

OTHER PUBLICATIONS

Tung, Title of Invention: Method of Decomposing Layout Design for Preparing Photomask Set Printed Onto Wafer by Photolithography, Method of Forming Photomask Set and Method of Fabricating Integrated Circuit, U.S. Appl. No. 14/534,190, filed Nov. 6, 2014.
Wang, Title of Invention: Method of Decomposing Layout for Generating Patterns on Photomasks, U.S. Appl. No. 14/692,723, filed Apr. 21, 2015.

* cited by examiner

*Primary Examiner* — Nha Nguyen
(74) *Attorney, Agent, or Firm* — Winston Hsu; Scott Margo

(57) ABSTRACT

An optical proximity correction (OPC) process is provided. The method comprising receiving a first pattern corresponding to a first structure of a semiconductor structure, and a second pattern corresponding to a second structure of said semiconductor structure. Next, a first OPC process is performed for the first pattern to obtain a revised first pattern, wherein the revised first pattern has a first shift regarding to the first pattern. A second OPC process is performed for the second pattern to obtain a revised second pattern, wherein the second OPC process comprises moving the second pattern according to the first shift.

6 Claims, 6 Drawing Sheets

OPTICAL PROXIMITY CORRECTION METHOD

BACKGROUND OF THE INVENTION

1. Field of the Invention

The present invention relates to an OPC process, and more particularly, to an OPC method for a dual damascene structure.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern. Currently, a technical called "optical proximity correction (OPC)" is developed. The OPC method is to imitate the feature that light passes through the photo-mask and to further compensate the pattern of the mask to form the desired pattern after the exposure process.

In the conventional arts, the "dual damascene" process is wildly used to form a metal interconnection system which is consisted of metal lines and plugs. However, the OPC method used for forming the masks of the metal interconnection system is not well studied.

SUMMARY OF THE INVENTION

The present invention therefore provides a method of fabricating an OPC method for a dual damascene structure.

Accordingly to one embodiment, an OPC process is provided. The method comprising receiving a first pattern corresponding to a first structure of a semiconductor structure, and a second pattern corresponding to a second structure of the semiconductor structure. Next, a first OPC process is performed for the first pattern to obtain a revised first pattern, wherein the revised first pattern has a first shift regarding to the first pattern. A second OPC process is performed for the second pattern to obtain a revised second pattern, wherein the second OPC process comprises moving the second pattern according to the first shift.

In the present invention, it is featured that the first structure and the second structure are two related structure and an additional aligning process is performed during the second OPC process by moving the second pattern toward a second distance, which is based on a first distance of the first pattern in the first OPC. By doing this, the connection between the first structure and the second structure can be ensured.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
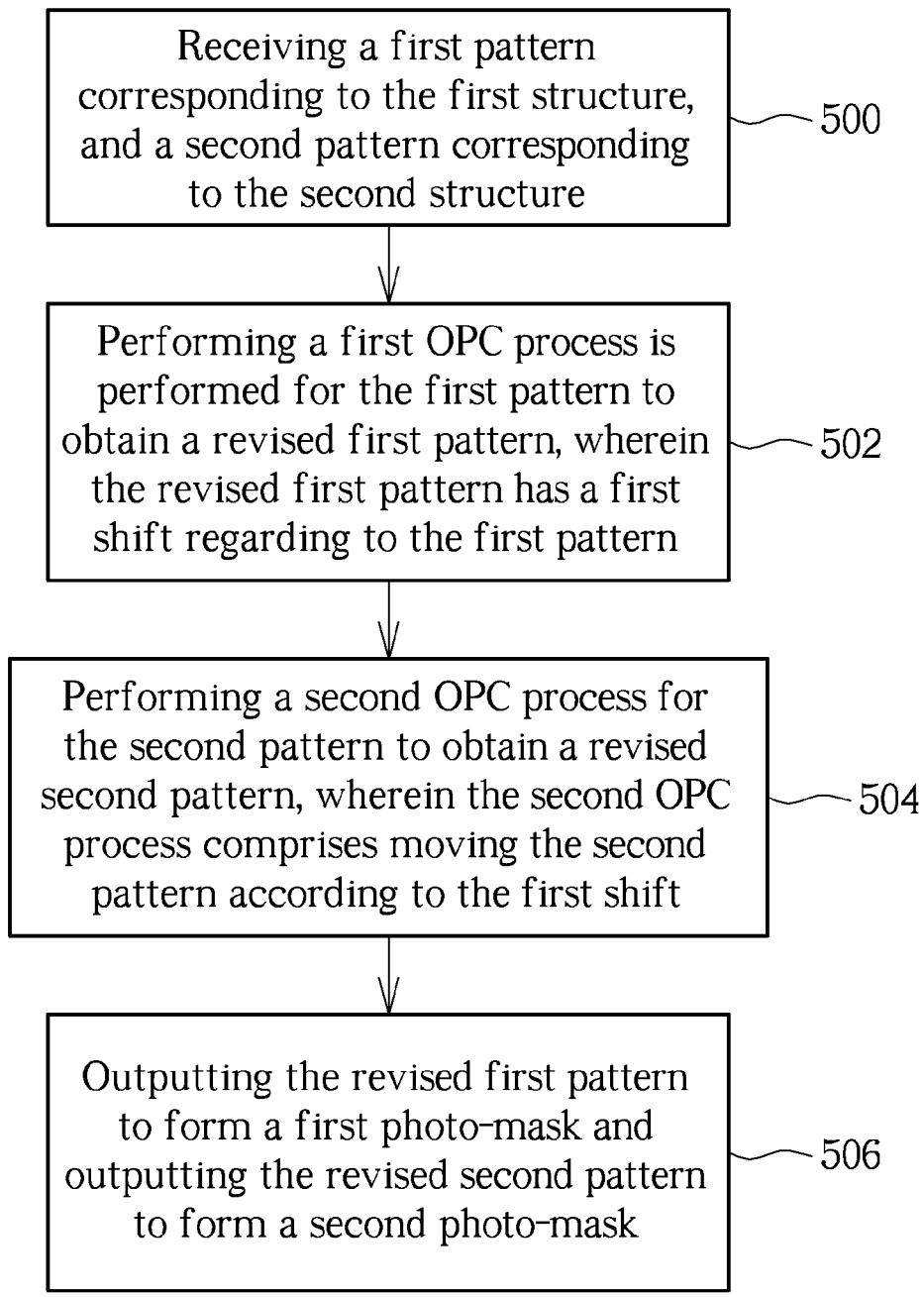
FIG. 1 shows a flow chart of the method of an optical proximity correction according to one embodiment of the present invention.

Please refer to FIG. 1, which shows a flow chart of the method of an optical proximity correction according to one embodiment of the present invention. Please also see FIG. 2 to FIG. 6, which shows schematic diagrams of the method of an OPC method according to one embodiment of the present invention.

Figure 2:
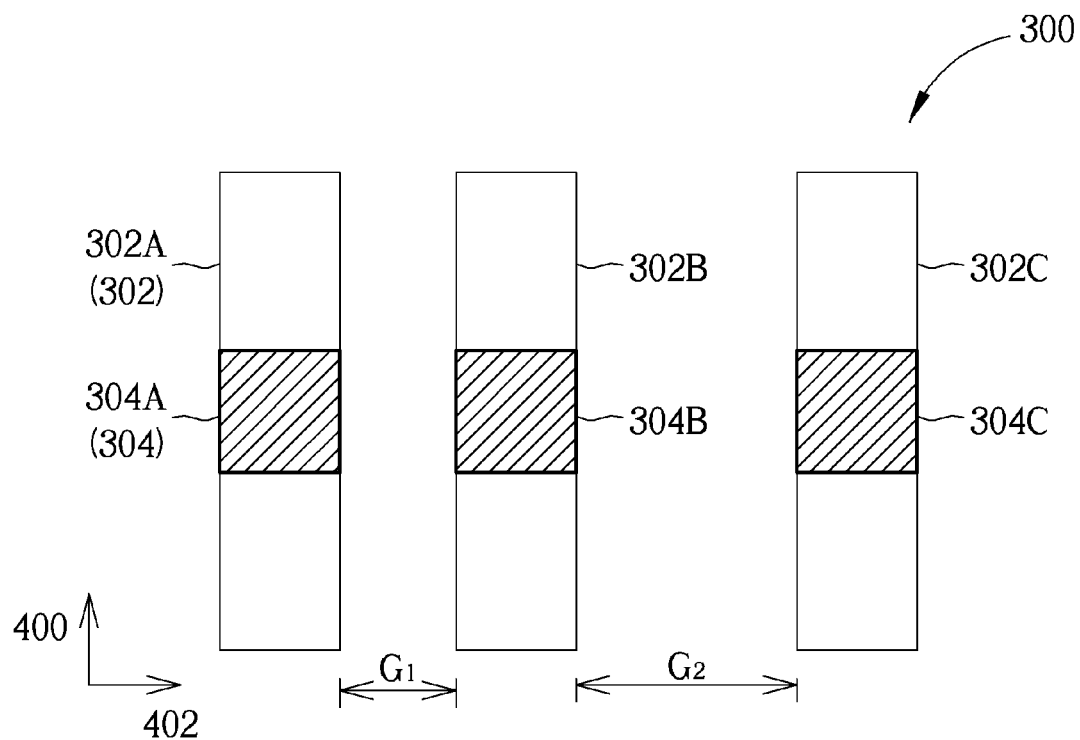
FIG. 2 to FIG. 6 shows schematic diagrams of the method of an OPC method according to one embodiment of the present invention.

As shown in FIG. 1 and FIG. 2, a layout 300 of an integrated circuit is imported into a computer (step 500). In one embodiment, the layout 300 may be in the form of GDSII or OASIS™ or some other format for describing various shapes, sizes, and relationships of elements of a semiconductor chip and can be imported into a database to be included with other information about the integrated circuit. The term "computer" in the present invention refers to any programmable apparatus that can execute any computer program instructions including multiple programs or threads. The multiple programs or threads may be processed approximately simultaneously to enhance utilization of the processor and to facilitate substantially simultaneous functions. As depicted in FIG. 2, the layout 300 includes a plurality of first patterns 302 and a plurality of second patterns 304. Each first pattern 302 is related to a first structure (not shown) which is to be formed in a semiconductor substrate (not shown), each second pattern 304 is related to a second structure (not shown) which is be to formed on the substrate, above or below the first structure. The first structure and the second structure are two strongly related structures and the positions thereof should be controlled precisely. For example, the first structure may be a metal line in a metal interconnection system and the second pattern may be a via plug, wherein the metal line of the first structure and the via plug of the second structure are fabricated by a dual damascene process. Thus, the alignment of the first structure and the second structure is important. Alternatively, the first structure and the second structure can be any semiconductor structures, for example, the first structure is a source/drain region of a transistor and the second structure is a contact plug. It is noted that the first structure and the second structure do not require to be two adjacent layers, that is, there can be one or more than one layer with other semiconductor structures disposed between the first structure and the second structure.

Please refer back to FIG. 2. In this embodiment, the first patterns 302A, 302B, 302C are stripe patterns that stretch along a first direction 400. The second patterns 304A, 304B, 304C are rectangle patterns, and each of which is located correspondingly to each of the first patterns 302A, 302B, 302C, respectively. Preferably, boundaries of each second pattern 304A, 304B, 304C completely coincide with boundaries of each first patterns 302A, 302B, 302C along the first direction 400. In another embodiment, the width (projection along the second direction 402) of the each second pattern 304A, 304B, 304C can be equal or smaller than those of each first patterns 302A, 302B, 302C. In addition, the gap G1 between the first pattern 302A and 302B is different from the gap G2 between the first pattern 302B and the 302C. Preferably, the first gap G1 is smaller than the second gap G2, and more preferably, the first gap G1 is smaller than a tolerance value that the semiconductor manufacturing system can afford.

Figure 3:
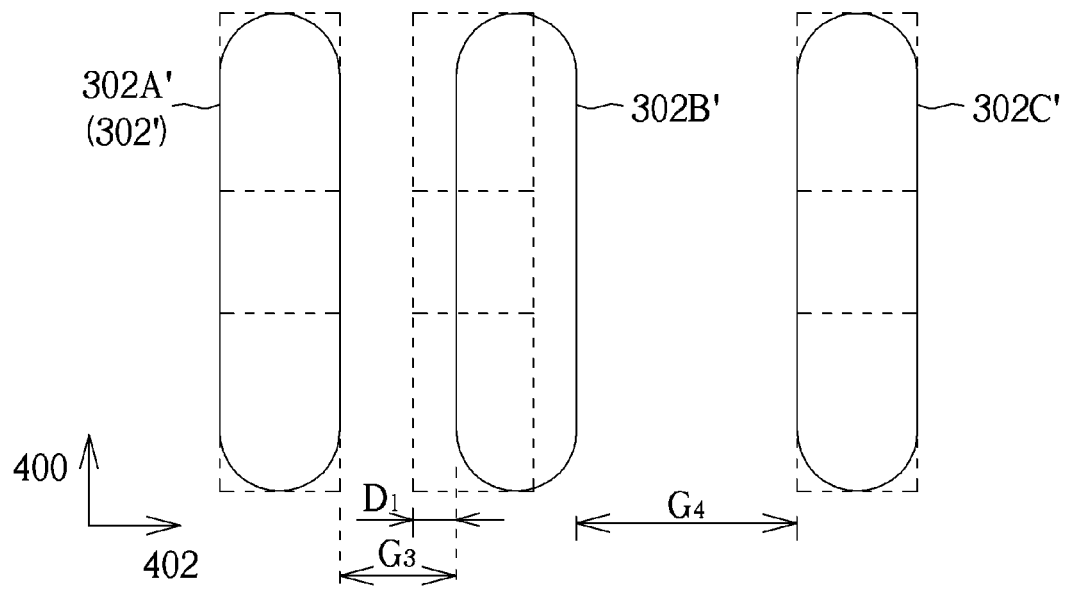

Next, as shown in FIG. 1 and FIG. 3, a first OPC process is performed for the first pattern 302 (step 502). The first OPC process comprises considering the parameters of the manufacturing process for forming the first pattern, including development, exposure, or etching or the like. After the first OPC process, a revised first pattern 302' is formed. The revised first pattern 302' may comprise different contour with respect to the original first pattern 302. For example, the revised first pattern 302' includes round corner, as shown in FIG. 3. In the present embodiment, since the first gap G1 is beyond a tolerance value of the semiconductor manufacturing system, after the first OPC process, the first pattern 302B has been moved toward the first pattern 302C by a first distance D1. Thus, both the third gap G3 and the fourth gap G4 are greater than the tolerance value and therefore can be formed without unwanted defects. The process window for forming structures with the revised first pattern 302' can therefore be enlarged.

Figure 4:
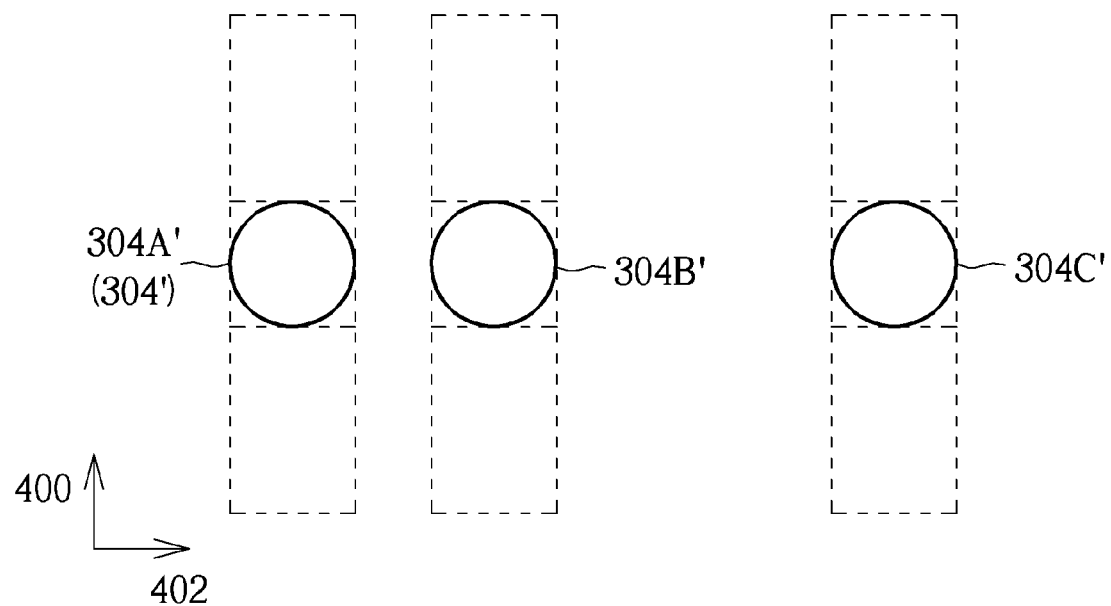
Figure 5:
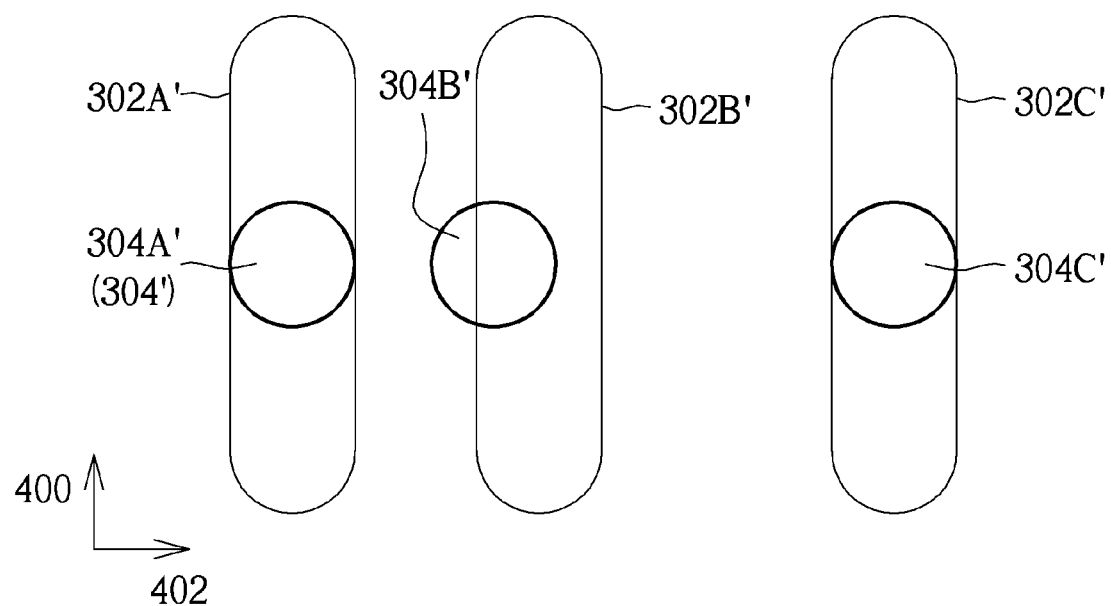

As shown in FIG. 4, a second OPC process is performed for the second pattern (step 504). The second OPC process comprises considering the parameters of the manufacturing process for forming the second pattern 304, including development, exposure, or etching or the like. After the second OPC process, a revised second pattern 304' is formed. The revised second pattern 304' may comprise different contour with respect to the original second pattern 304. For example, the second pattern 302' includes round corner, as shown in FIG. 4. However, since the second pattern 304 is originally a rectangle shape, instead of line stripe like the first pattern 302, the computer would regard that the first gap G1 between the revised second pattern 304A' and 304B' is still within the tolerance value, and would not move the position of the second pattern 304B'. Thus, by comparing the two revised patterns after the first OPC process and the second OPC process, as shown in FIG. 5, the revised second pattern 304B' does not well correspond to the revised first pattern 302B'.

Figure 6:
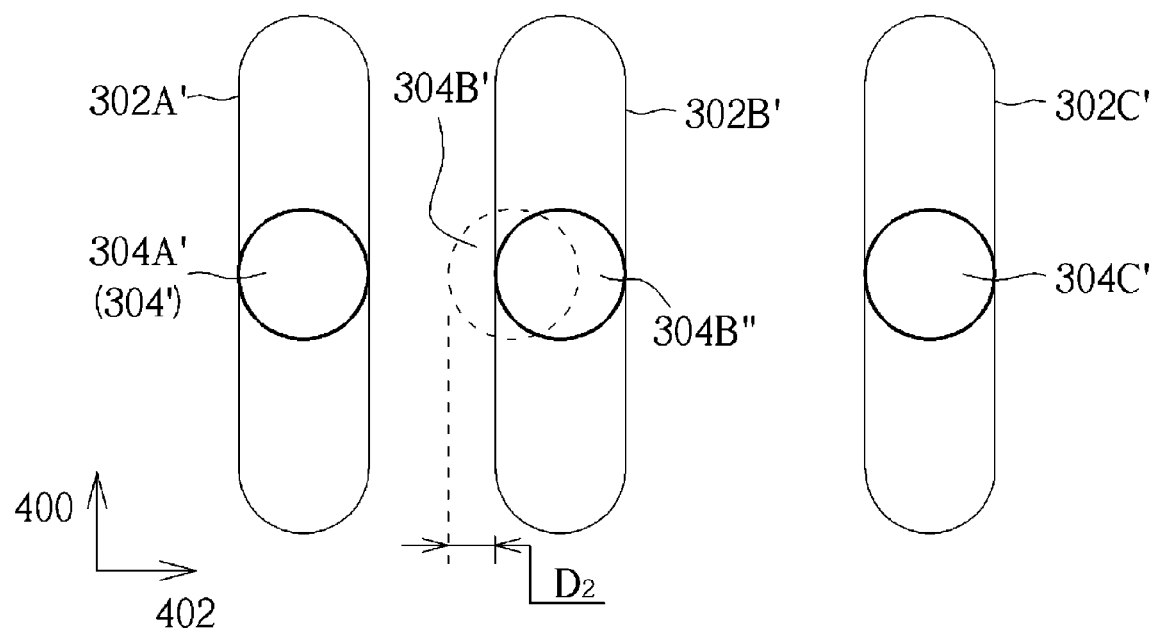

Since the first structure of first pattern 302 and the second structure of the second pattern 304 are two related structures, the relative positions thereof should be well considered. As such, as shown in FIG. 1 and FIG. 6, after adjusting the contour of the second pattern 304, the second OPC process further includes an aligning process to move the revised second pattern 304'. The aligning process considers the final position of the first revised pattern 302' to make sure the relative position of the first structure and the second structure can still be remained. In one embodiment, as shown in FIG. 6, the revised second pattern 304B' is moved toward the revised second pattern 304C' by a second distance D2, thereby forming another revised second pattern 304B". The second distance D2 can be equal or smaller than the first distance D1, depending on the design. Preferably, the second distance D2 is substantially equal to the first distance, thus the revised second pattern 304B" can completely coincide with the revised first pattern 302B' and a maximum overlapping region of the revised second pattern 304B" and the revised first pattern 302B' can be obtained.

Finally, as shown in FIG. 1, the revised first pattern is output to form a first photo-mask and the revised second pattern is output to form a second photo-mask (step 506). By using the first photo-mask and the second photo-mask, the relationship between the first structure and the second structure can therefore be remained.

Figure 7:
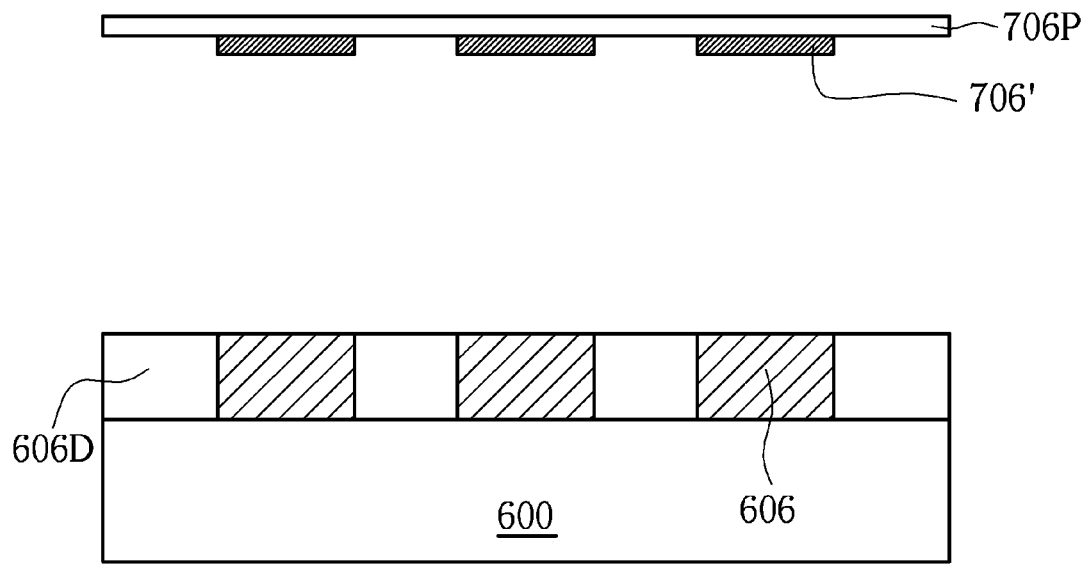
FIG. 7 to FIG. 10 show schematic diagrams of the method of fabricating a semiconductor structure according to one embodiment of the present invention.

The following context will show one example for forming semiconductor structure with the OPC process shown above. Please see FIG. 7 to FIG. 10, which show schematic diagrams of the method of fabricating a semiconductor structure according to one embodiment of the present invention. As shown in FIG. 7, a substrate 600 is provided. The substrate 600 may be a silicon substrate or a dielectric layer on the silicon substrate, but is not limited thereto. A third dielectric layer 606D are disposed on the substrate 600. A third structure 606 including a plurality of metal lines is formed in the third dielectric layer 606D. In one embodiment, the third structure 606 is formed by, for example, forming a plurality of trenches in the third dielectric layer 606D by using a third photo-mask 706P having a revised third pattern 706', which are corresponding to the third structure 606. Thereafter, the trenches are filled with conductive material and a planarization process is performed. The third photo-mask 706P may be formed by outputting the revised third pattern 706', wherein the revised third pattern 706' is obtained through a third OPC process based on the pattern of the third structure 606.

Figure 8:
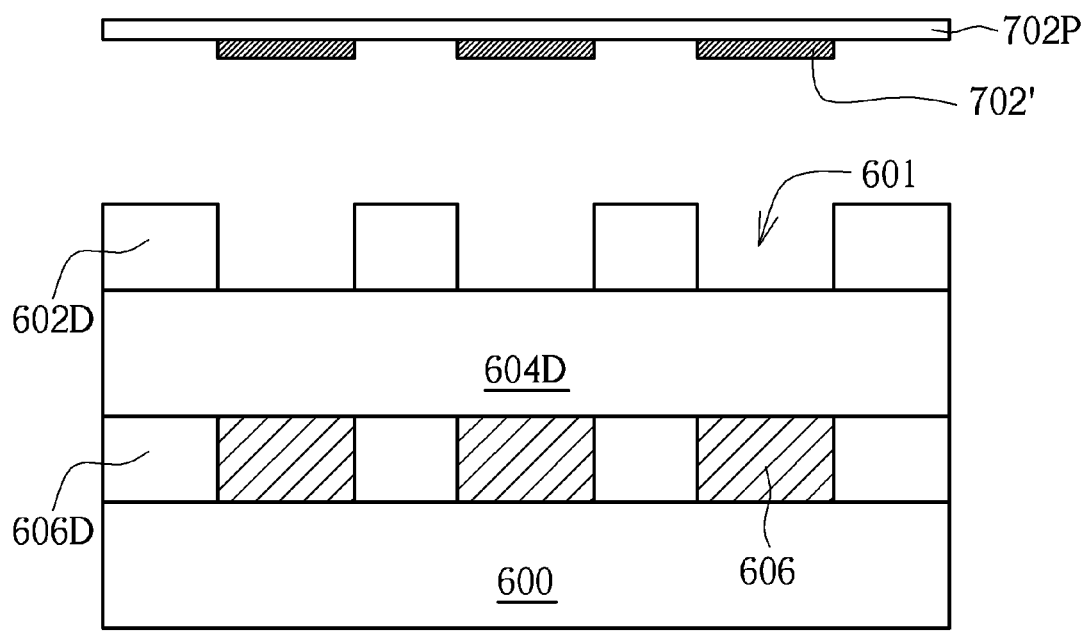

Next, as shown in FIG. 8, a second dielectric layer 604D and a first dielectric layer 602D are formed on the third dielectric layer 606D. A plurality of trenches 601 are formed in the first dielectric layer 602D by using a first photo-mask 702P having a revised first pattern 702'. The first photo-mask 702P may be formed by outputting the revised first pattern 702', wherein the revised first pattern 702' is obtained by a first OPC process based on the pattern of the first structure.

Figure 9:
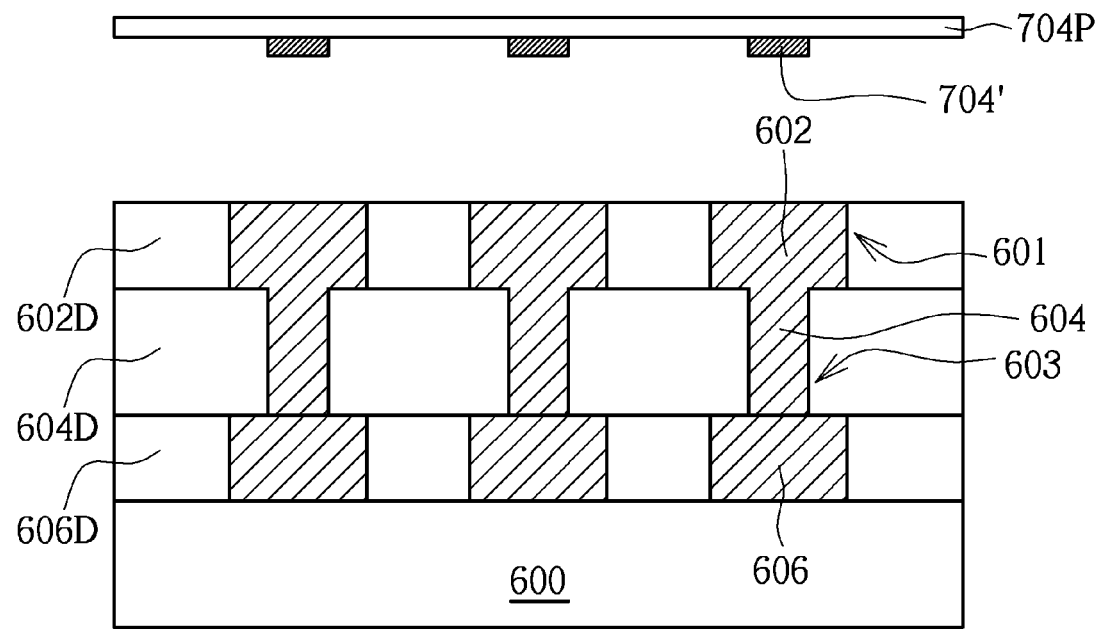
Figure 10:
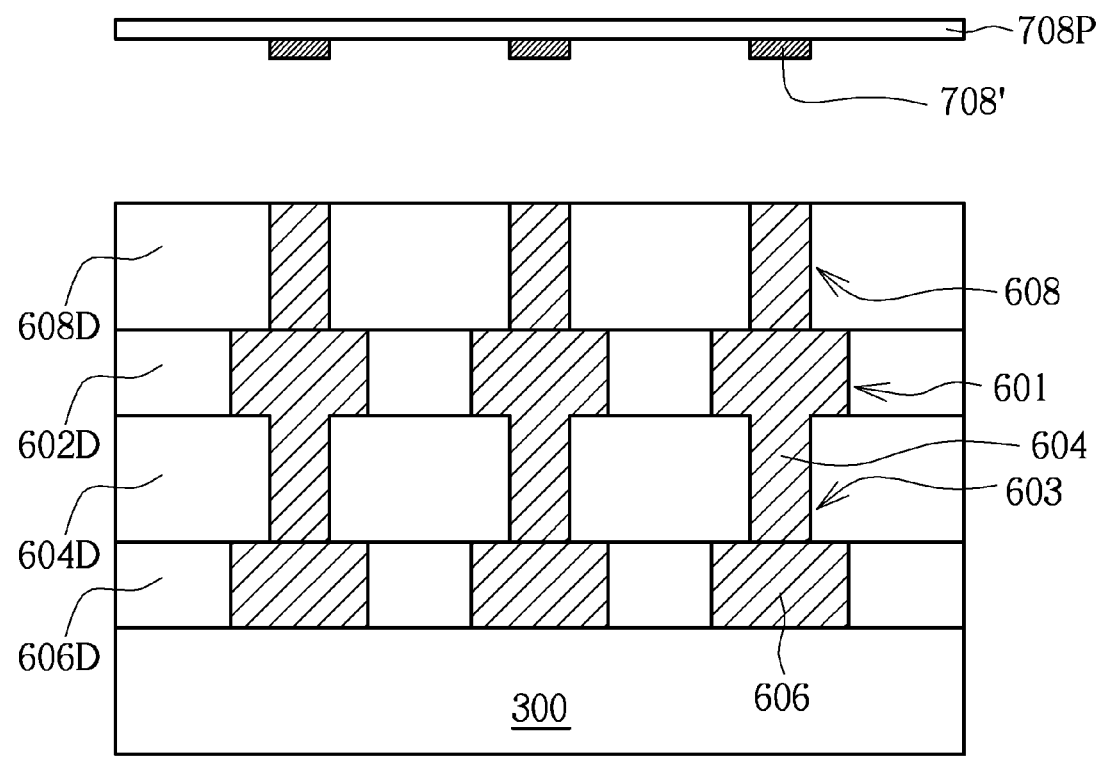

Another patterning process is performed by using a second photo-mask 704P having a revised second pattern 704', as shown in FIG. 9, to form a plurality of vias 603 in the second dielectric layer 604D. The second photo-mask 704P may be formed by outputting the revised second pattern 704', wherein the revised second pattern 704' is obtained by a second OPC process based on the pattern of the second structure. After filling a conductive layer into the trench 601 and the vias 603, a plurality of dual damascene structures are therefore formed. As shown in FIG. 9, the dual damascene structures are comprised of the first structure 602, in a form of metal line, and the second structure 604, in a form of via plug.

Next, a fourth dielectric layer 608D with a fourth structure 608 disposed therein are formed on the first dielectric layer 602D. The fourth structure 608 includes a plurality of via plugs. In one embodiment, the fourth structure 608 is formed by, for example, forming a plurality of vias in the fourth dielectric layer 608D by using a fourth photo-mask 708P having a revised fourth pattern 708' corresponding to fourth structure 608, followed by filling the vias with conductive material and performing a planarization process. The fourth photo-mask 708P may be formed by outputting the revised fourth pattern 708', wherein the revised fourth pattern 708' is obtained by a fourth OPC process based on the pattern of the fourth structure.

In the present embodiment, the revised first pattern 702' on the first photo-mask 702P and the revised second pattern 704' on the second photo-mask 704P can be formed by using the OPC method as shown in the flow chart in FIG. 1. In one embodiment, the first OPC process for forming the revised first pattern 702' further comprise considering the pattern of the fourth structure 608. The second OPC process for forming the revised second pattern 704' further comprise considering the third structure 606. Accordingly, by using the process shown above, the dual damascene structure containing the first structure 602 and the second structure 604 can be precisely formed without short phenomenon.

In summary, the present invention provides a method of fabricating a semiconductor structure. The semiconductor structure contains a first structure relating to a first pattern on a first photo-mask, and a second structure relating to a second pattern on a second photo-mask. The first pattern and the second pattern are obtained by a first OPC process and a second OPC process. It is featured that the first structure and the second structure are two related structure and an additional aligning process is performed during the second OPC process by moving the second pattern toward a second distance, which is based on a first distance of the first pattern in the first OPC process. By doing this, the connection between the first structure and the second structure can be insured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical proximity correction (OPC) method, comprising:

importing a first pattern and another first pattern respectively corresponding to two first structures of a semiconductor structure, and a second pattern and another second pattern respectively corresponding to two second structures of the semiconductor structure into a computer, wherein the second pattern is located correspondingly to the first pattern, the another second pattern is located correspondingly to the another second pattern, a first gap is spaced between the first patterns, and the first gap is smaller than a tolerance value of a semiconductor manufacturing system;

performing a first OPC process to move the first pattern in a direction away from the another first pattern by a first shift to obtain two revised first patterns by using the computer, wherein the first shift exists between one of the revised first patterns corresponding to the first pattern and the first pattern, and a second gap spaced between the revised first patterns is greater than the tolerance value; and performing a second OPC process to move the second pattern in the direction away from the another second pattern by a second shift according to the first shift to obtain two revised second patterns by using the computer, wherein the second shift exists between one of the revised second patterns corresponding to the second pattern and the second pattern, and the first shift is substantially equal to the second shift.

2. The OPC method according to claim 1, wherein performing the second OPC process further comprises changing a contour of each of the second patterns, and a contour of each of the revised second patterns is different from the contour of each of the second patterns.

3. The OPC method according to claim 1, wherein a center of each of the revised second patterns corresponds to a center of each of the revised first patterns respectively.

4. The OPC method according to claim 1, wherein the second OPC process further comprises considering a second lithography-etching-process for forming the second structure.

5. The OPC method according to claim 1, further comprising:

outputting the revised first patterns to a first photo-mask; and outputting the revised second patterns to a second photo-mask.

6. The OPC method according to claim 1, wherein boundaries of each of the second patterns coincide with boundaries of each of the first patterns respectively.

* * * * *